US007910429B2

(12) United States Patent
Dong et al.

(10) Patent No.: US 7,910,429 B2
(45) Date of Patent: Mar. 22, 2011

(54) METHOD OF FORMING ONO-TYPE SIDEWALL WITH REDUCED BIRD'S BEAK

(75) Inventors: Zhong Dong, San Jose, CA (US);
Chuck Jang, Fremont, CA (US);
Ching-Hwa Chen, Milpitas, CA (US);
Chunchieh Huang, Fremont, CA (US);
Jin-Ho Kim, San Jose, CA (US);
Vei-Han Chan, San Jose, CA (US);
Chung Wai Leung, Milpitas, CA (US);
Chia-Shun Hsiao, Cupertino, CA (US);
George Kovall, Campbell, CA (US);
Steven Ming Yang, Milpitas, CA (US)

(73) Assignee: ProMOS Technologies, Inc., Hsin-Chu (TW)

(*) Notice: Subject to any disclaimer, the term of this patent is extended or adjusted under 35 U.S.C. 154(b) by 0 days.

(21) Appl. No.: 10/821,100

(22) Filed: Apr. 7, 2004

(65) Prior Publication Data
US 2005/0227437 A1    Oct. 13, 2005

(51) Int. Cl.
*H01L 21/336* (2006.01)
(52) U.S. Cl. ........... 438/257; 257/324; 257/E21.209; 257/E29.129; 257/E21.625
(58) Field of Classification Search .......... 438/216, 438/257, 261, 287, 770, 773; 257/324, E21.625, 257/E21.209, E29.129
See application file for complete search history.

(56) References Cited

U.S. PATENT DOCUMENTS

| | | | | |
|---|---|---|---|---|
| 5,284,786 A * | 2/1994 | Sethi | | 438/261 |
| 5,557,122 A | 9/1996 | Shrivastava et al. | | |
| 6,127,227 A * | 10/2000 | Lin et al. | | 438/261 |
| 6,566,210 B2 * | 5/2003 | Ajmera et al. | | 438/303 |
| 6,667,197 B1 * | 12/2003 | Gluschenkov et al. | | 438/165 |
| 6,699,777 B2 * | 3/2004 | Agarwal | | 438/592 |
| 6,706,613 B2 * | 3/2004 | You et al. | | 438/424 |
| 6,806,517 B2 * | 10/2004 | Kim et al. | | 257/204 |
| 6,830,973 B2 * | 12/2004 | Fujimoto et al. | | 438/257 |
| 2003/0124873 A1 * | 7/2003 | Xing et al. | | 438/770 |
| 2005/0110102 A1 * | 5/2005 | Wang et al. | | 257/411 |

* cited by examiner

*Primary Examiner* — David Vu
(74) *Attorney, Agent, or Firm* — Haynes and Boone, LLP

(57) ABSTRACT

Conventional fabrication of sidewall oxide around an ONO-type memory cell stack usually produces Bird's Beak because prior to the fabrication, there is an exposed sidewall of the ONO-type memory cell stack that exposes side parts of a plurality of material layers respectively composed of different materials. Certain materials in the stack such as silicon nitrides are more difficult to oxidize than other materials in the stack such polysilicon. As a result oxidation does not proceed uniformly along the multi-layered height of the sidewall. The present disclosure shows how radical-based fabrication of sidewall dielectric can help to reduce the Bird's Beak formation. More specifically, it is indicated that short-lived oxidizing agents (e.g., atomic oxygen) are able to better oxidize difficult to oxidize materials such as silicon nitride and the it is indicated that the short-lived oxidizing agents alternatively or additionally do not diffuse as deeply through already oxidized layers of the sidewall such as silicon oxide layers. As a result, a more uniform sidewall dielectric can be fabricated with more uniform breakdown voltages along it height.

21 Claims, 11 Drawing Sheets

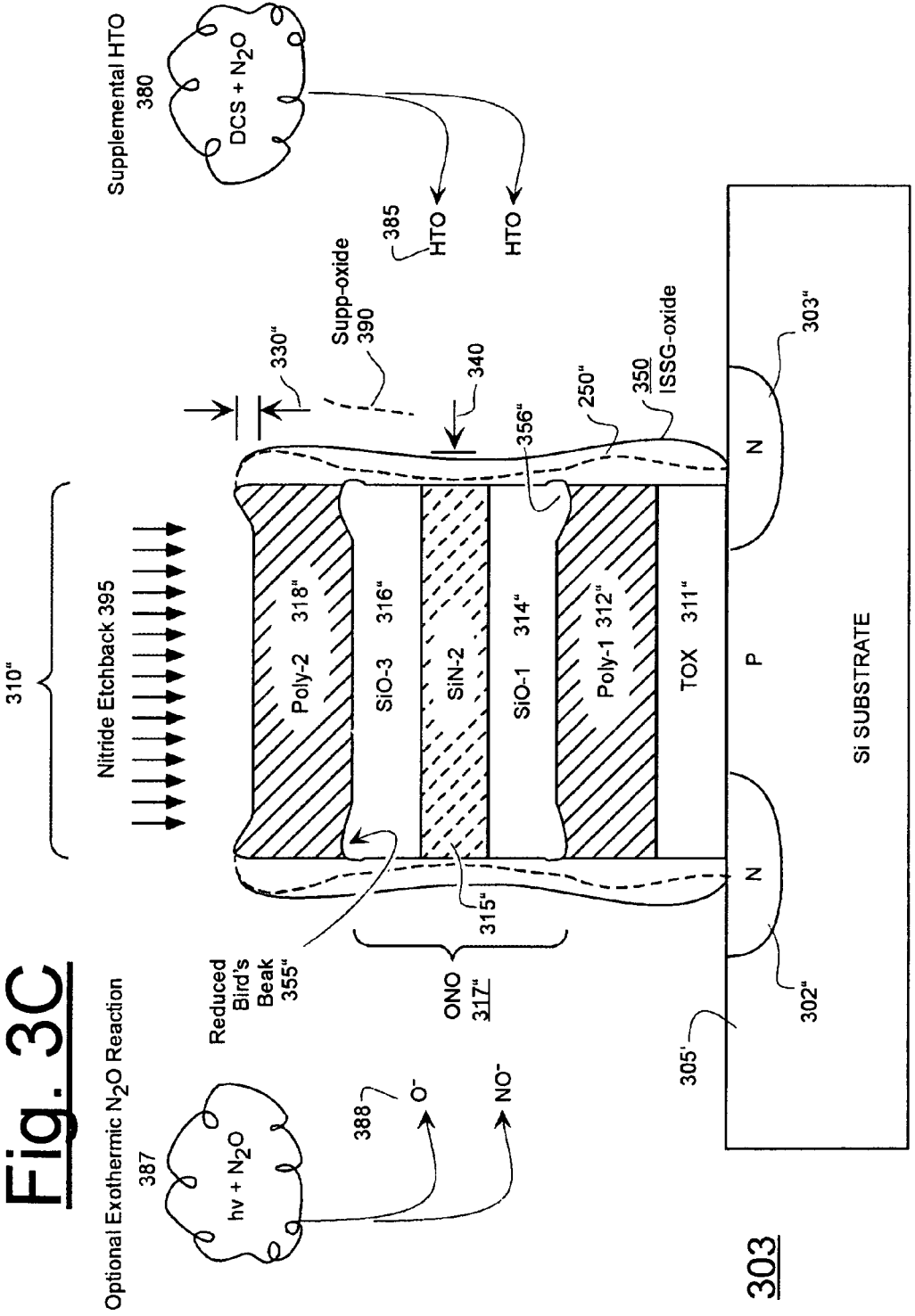

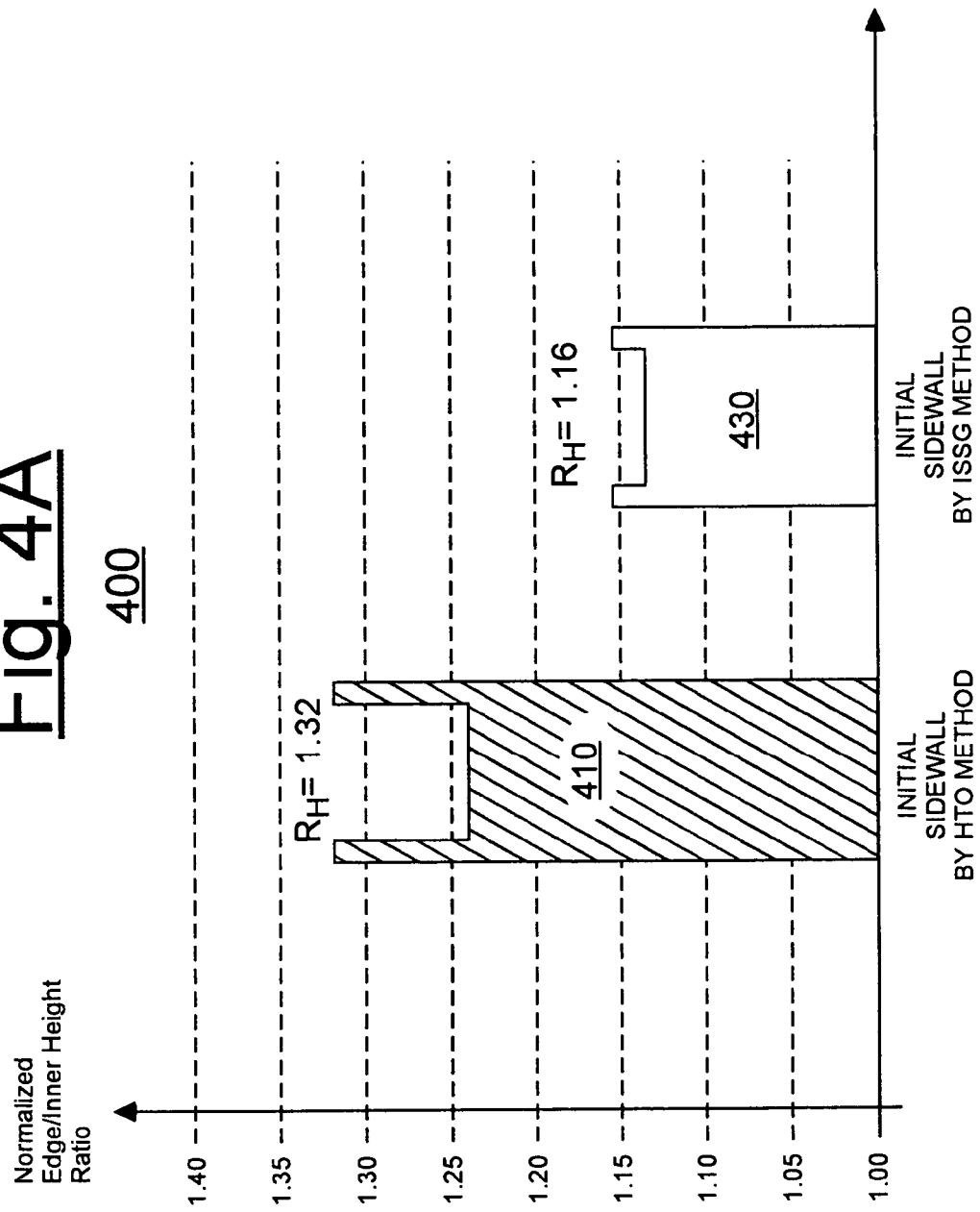

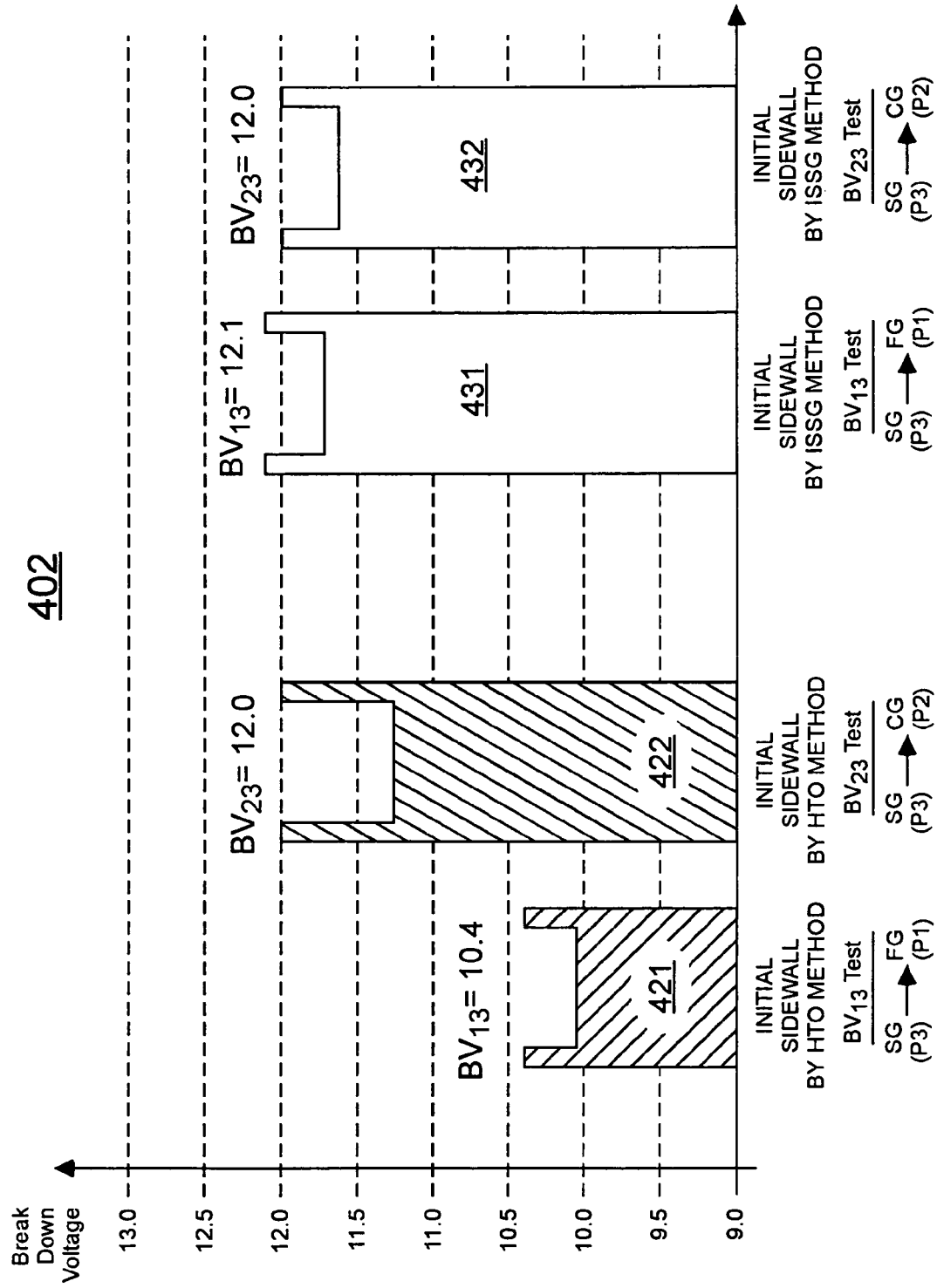

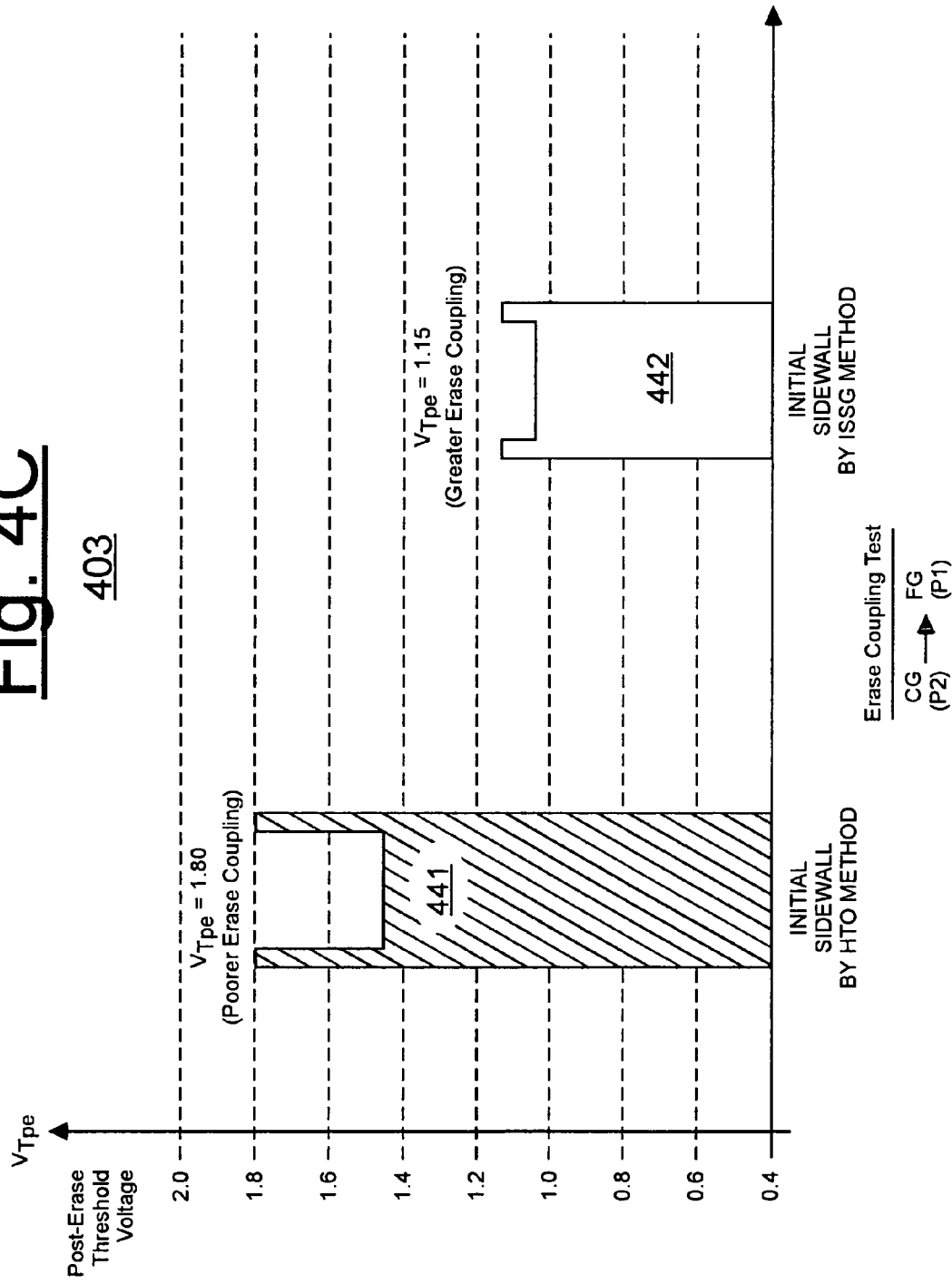

METHOD OF FORMING ONO-TYPE SIDEWALL WITH REDUCED BIRD'S BEAK

CROSS REFERENCE TO CO-OWNED APPLICATIONS

The following copending U.S. patent applications are owned by the owner of the present application, and their disclosures are incorporated herein by reference:

(A) Ser. No. 10/442,759 filed May 20, 2003 by Zhong Dong et al. and which is originally entitled, Methods for Improving Quality of High Temperature Oxide (HTO) Formed from Halogen-Containing Precursor and Products Thereof and Apparatus Therefor.

FIELD OF DISCLOSURE

The present disclosure of invention relates generally to fabrication of monolithically integrated semiconductor devices.

The disclosure relates more specifically to the formation of sidewall insulation for a charge-retaining structure used in non-volatile reprogrammable memory such as the type generically known as an ONO stack.

DESCRIPTION OF RELATED ART

So-called, FLASH memory devices and alike forms of electrically re-programmable and nonvolatile memory devices have become commercially popular due in part to their ability to store data in a small and dense form factors, their ability to be repeatedly and quickly re-programmed, and their ability to retain programmed data in a nonvolatile fashion so that even when power is lost, the stored data is preserved.

One relatively simple format for such an electrically re-programmable type of nonvolatile memory is known as the vertically-stacked gate configuration. In this configuration, a so-called "floating gate" (FG) electrode is insulatively sandwiched between an underlying, tunnel insulator layer and an overlying, inter-gates insulator (IGI) layer. A so-called "control gate" (CG) electrode is stacked atop the inter-gates insulator (IGI) layer. In some embodiments (NAND Flash) there is also a select gate (SG) for enabling a group of cells. Under the tunnel insulator layer (beneath the FG) there is typically provided a channel region with opposed source (S) and drain (D) regions.

Because of the way the layers are stacked, the IGI layer (inter-gates insulator layer) is sandwiched at least between the floating gate electrode (FG) and the control gate electrode (CG). A further insulator may be formed between the control gate electrode (CG) and the select gate (SG). The inter-gates insulator (IGI) layer typically contains a series of different dielectric materials. The classical combination is that of silicon oxide, silicon nitride and again silicon oxide, hence the name, ONO. Such sandwiching of different kinds of material layers between the memory cell gates as well as the materials of the memory cell gates can create problems as will be further explained shortly. In passing, it is to be observed that other types of more complicated configurations of gate electrodes are possible beyond the simple stacking of CG on FG. These other configurations may include various staggered gate configurations. The example of the simpler, stacked gate configuration will be sufficient for describing the improvement disclosed herein.

The insulatively-isolated floating gate (FG) of a stacked gate cell is intended to store a certain amount of charge and retain that stored charge even when external power is turned off. The amount of charge stored on the FG can be used to define the data state of the memory cell. The state of the memory cell can be altered by moving charge into the FG for representing a first data state and by removing charge from the FG for representing another data state. Different mechanisms may be used for injecting charge into or removing charge from the FG, including hot carrier injection and/or Fowler-Nordheim tunneling. The charged or uncharged state of the floating gate (FG) can be sensed by applying a cell-read voltage $V_{GS-read}$ to the control gate (CG), where the cell-read voltage $V_{GS-read}$ is selected to cause a first magnitude of current conduction between the drain (D) and source (S) regions of the cell when the floating gate (FG) is in a first programmed state and to cause no or a different magnitude of IDS to flow when the floating gate (FG) is in another programmed state. (Some devices store multiple data bits per cell, where each of different amounts of charge trapped within the FG represents a different multi-bit pattern.) During data write and/or erase operations, it is common to apply relatively large voltages ($V_{GS-write}$ or $V_{GS-erase}$) to the control gate (CG) so as to induce Fowler-Nordheim tunneling and/or other charge transport mechanisms between the floating gate (FG) and one or more other electrode regions within the memory cell.

It is important, for purposes of carrying out the various read and write/erase operations of floating gate type memory cells (e.g., stacked gate cells), to establish an appropriate pattern of electric field intensities across the insulators that surround the charge-storing, floating gate (FG). These electric fields (E-fields) may be established by generating correspondingly appropriate voltages between the control gate (CG), the drain (D), the source (S) and/or substrate (U) regions of the memory cell. Those skilled in the art will appreciate that electric field intensity in dielectric insulators is usually a function of voltage difference (V) divided by dielectric thickness (d) and multiplied by dielectric constant (E=kV/d). Capacitive coupling is a function of plate area divided by dielectric thickness (C=f(kA/d)). In order to get consistent results from mass produced devices, it is important to maintain precise control over the per-cell plate-area (A), the dielectric thickness (d) and the dielectric constant (k) of the various insulators which surround the FG of each cell so that same results will occur in one device and the next for a given control gate voltage ($V_{CG}$). Stated otherwise, consistently same capacitive coupling without excessive leakage should occur from one mass produced device to the next between the CG, the FG, the source (S), the drain (D) and the substrate (U).

Persons skilled in the art will appreciate that most insulators are not perfect. A small amount of leakage current can undesirably flow through them. They can undergo high voltage breakdown. Contaminating chemicals can pass through pinhole or other defects in the insulators. Much progress has been made in the formation of the so-called, thermal gate oxide insulator that lies between the substrate and the floating gate (FG). However, the inter-gates insulator layer (IGI) that is typically sandwiched between the FG and the CG still poses numerous problems.

The inter-gates insulator layer (IGI) is particularly prone to problems with leakage current and premature breakdown. Practitioners in the art have developed a so-called ONO solution. According to basic ONO practice, after the material for the floating gate (FG) is deposited (typically it is doped polysilicon), three insulative layers are vapor deposited in sequence. The three insulative layers are respectively composed of silicon-Oxide, silicon-Nitride and silicon-Oxide; hence the ONO acronym. The material for the control gate (CG) is then deposited (typically it is doped polysilicon) on top of the ONO structure. The ONO structure is advantageous because silicon-nitride ($Si_3N_4$) generally has a greater dielectric constant (k) than does silicon dioxide ($SiO_2$). The higher dielectric constant of the silicon-Nitride layer in the ONO stack lets cell designers use lower gate voltages than would otherwise be possible for an equal thickness of insulator material made of only silicon-oxide. It is desirable to keep gate voltages relatively small. The ONO approach allows this to happen.

Despite improvements in fabrication techniques, the ONO approach still suffers from various problems including: the existence of small leakage currents between the FG and the CG; and variations in dimensions of layer thicknesses in the ONO layers and variations of material quality within the different materials of the ONO stack.

More specifically, one of the problems that plagues ONO stacks is that of Bird's Beak formation during mass production fabrication of the ONO stack sidewalls. Just as it is desirable to provide a good electrical insulator at the top of the floating gate (FG), between it and the control gate (CG), it is further desirable to surround the sidewalls of the FG and the rest of the ONO stack structure with good quality insulation. However, the very fact that the ONO stack contains different materials, most notably: a silicon nitride layer or the like, makes it difficult to consistently form sidewall insulation of both good quality and consistent dimensions. Silicon nitride resists conventional oxidation. As a result, when sidewall oxide is first being formed, the oxidation reaction preferentially expands into the sidewall material of the floating gate electrode (FG) and/or of the control gate electrode (CG) while leaving the side of the silicon nitride layer relatively un-oxidized. This differential behavior often results in the formation of a Bird's Beak geometry. Dielectric thickness is no longer uniform across device layers and it becomes more difficult to guarantee consistent device performance for mass-produced memory cells. Often the sidewall of the ONO stack is seen to have a substantially different height dimension than that of the middle of the ONO stack due to Bird's Beak development as will be explained in more detail below. The present disclosure shows how such Bird's Beak formation may be reduced.

INTRODUCTORY SUMMARY

Structures and methods may be provided in accordance with the present disclosure of invention for improving over the above-described sidewall fabrication problems.

More specifically, in accordance with one set of aspects of the present disclosure, a high-kinetics, dry oxidation process (ISSG) is used to initially oxidize an ONO sidewall area where the initial oxidation process includes the generation of atomic oxygen radicals or other such short-lived oxidizing agents for more uniformly producing oxides along nitride-containing regions and along silicon-containing regions.

A sidewall forming method in accordance with the present disclosure comprises: (a) providing an ONO-type memory cell stack where at least one sidewall of the ONO-type memory cell stack is exposed and includes a plurality of material layers respectively composed of different materials, and (b) generating a sufficient amount of atomic oxygen near said at least one, otherwise exposed sidewall of the ONO-type memory cell stack so as to substantially oxidize exposed sidewall regions of those of the different materials of the ONO-type memory cell stack that are not substantially oxidized prior to said subjecting of the at least one otherwise exposed sidewall to atomic oxygen generating step. In one set of embodiments, the atomic oxygen generating step is part of a dry ISSG process that includes: (a.1) flowing molecular oxygen ($O_2$) towards the stack; and (a.2) flowing molecular hydrogen (H2) towards the stack, where the volumetric flow ratio of the $H_2$ to the O2 is less than about 0.2.

Other aspects of the disclosure will become apparent from the below detailed description.

BRIEF DESCRIPTION OF THE DRAWINGS

The below detailed description section makes reference to the accompanying drawings, in which:

FIG. 3C is a schematic, side cross sectional diagram corresponding to FIG. 2A and showing how sidewall dielectric uniformity may be improved, and Bird's Beak formation may be reduced by a free radical, initial oxidizing process such as that of FIG. 3A, and further showing how a supplemental other oxidizing process (e.g., HTO) may be carried out after the initial oxidizing of sidewall with free radicals (e.g., atomic oxygen);

FIG. 4A is a first bar graph showing edge height to middle height ratios found for memory cells having HTO formed sidewalls and for memory cells having ISSG formed sidewalls;

FIG. 4B is a second bar graph showing breakdown voltage results for NAND-type memory cells having HTO formed sidewalls and those having ISSG formed sidewalls; and FIG. 4C is a third bar graph showing post-erase, threshold voltage results for NAND-type memory cells having HTO formed sidewalls and those having ISSG formed sidewalls.

DETAILED DESCRIPTION

Figure 1A:
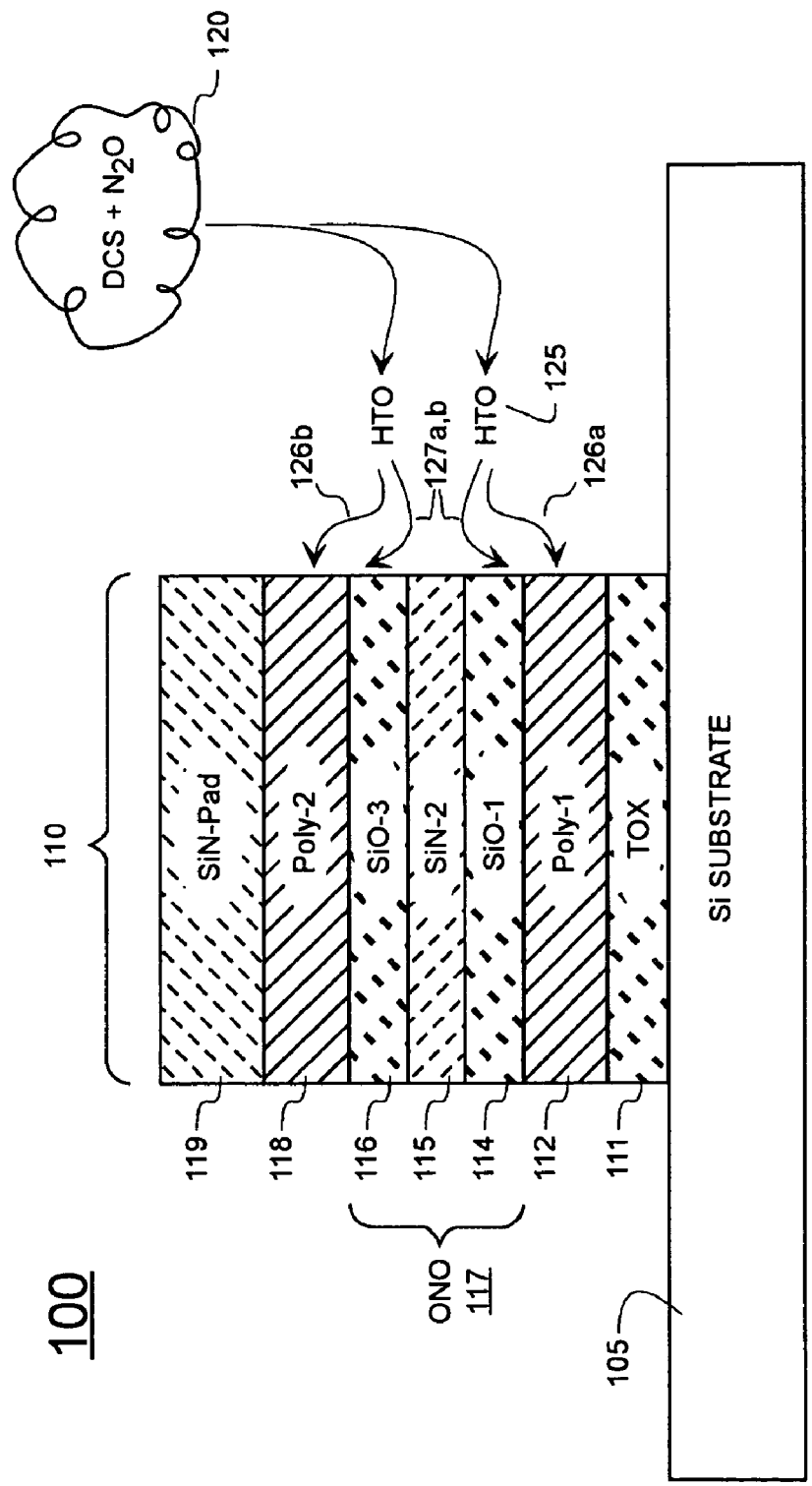
FIG. 1A is a schematic, side cross sectional diagram showing the start of a conventional process in which oxide sidewall material is to be deposited (e.g., via HTO—High Temperature Oxidation) on the sidewalls of a pre-formed and patterned ONO memory cell stack.

FIG. 1A is a schematic, side cross sectional diagram showing the start of a conventional deposition process 100 wherein oxide sidewall material is to be formed on the sidewalls of a pre-formed and pre-patterned ONO memory cell stack 110 by way of a conventional chemical vapor deposition (CVD) process.

More specifically, a monocrystalline silicon substrate 105 has been provided prior to the start of the sidewall oxidation process. A so-called, tunnel oxide layer (TOX) 111 has been formed on the substrate by thermal growth or otherwise. A first polysilicon layer (Poly-1) 112 has been deposited for later defining the so-called, floating gate (FG) of a corresponding memory cell. On top of the Poly-1 layer 112, a first silicon oxide layer (SiO-1) 114 has been formed to begin definition of the so-called, ONO stack 117. This has been followed by deposition of a silicon nitride layer (SiN-2) 115 and subsequent deposition of a second silicon oxide layer (SiO-3) 116. The triad of the SiO-1 layer 114, SiN-2 layer 115 and SiO-3 layer 116 will define the ONO stack 117. (Although a conventional, oxide-nitride-oxide combination is described for purpose of example, it is within the contemplation of the disclosure that other stacks of different dielectric materials may be used in place of the fundamental ONO stack 117, for example, a NONO stack which may include oxynitride layers within it. The gate electrodes may additionally, be made of materials other than polysilicon.)

After the SiO-3 layer 116 is defined, but before the illustrated tower structure is formed through patterning, a second polysilicon layer (Poly-2) 118 is deposited for later defining the so-called, control gate (CG) of the corresponding memory cell. On top of the Poly-2 layer 118, a sacrificial passivating layer of silicon nitride (SiN-Pad) 119 is formed. Then photolithography and/or other patterning steps are used to define an etch mask (not shown). An etchback is performed down to the top surface of the semiconductor substrate 105 so as to thereby leave the illustrated ONO memory cell stack 110 towering above or protruding from the substrate 105 as shown. Those skilled in the art will appreciate that many copies of the illustrated one ONO memory cell stack 110 will be protruding from the substrate and in spaced apart relation to one another after the etchback process is performed. For sake of simplicity, only one ONO tower is shown. (Those skilled in the art will also appreciate that the etchback through the different material layers of the ONO tower—that is, through the nitrides, oxides and polysilicon layers of the example—will typically entail different etch chemistries, each tailored to selectively remove the targeted material. Such details are not relevant to the present disclosure. What is relevant is that tower sidewall are produced having different materials exposed along the sidewalls due to the different material layers of the ONO tower.)

Although FIG. 1A shows the first and second polysilicon layers (112, 118) as having same cross hatching, this does not mean that the Poly-1 and Poly-2 layers are necessarily exactly the same. More often than not, there will be differences because the Poly-1 and Poly-2 deposition processes are usually carried out at different times, under different conditions and/or while using different type and/or concentrations of conductivity dopants and/or formation chemistries. As a result the Poly-1 and Poly-2 layers (112, 118) may be composed of materials with different grain sizes, different porosities, and/or different other attributes. Similarly, the silicon oxide compositions of TOX layer 111, SiO-1 layer 114, and SiO-3 layer 116 will usually have different respective attributes. The silicon nitride layers 115, 119 will usually have different respective attributes. Such differentiated attributes of the various layers in the ONO tower can add to the complexity of what next happens as shall become apparent shortly.

After the etchback process leaves the illustrated ONO memory cell stack 110 protruding from the substrate 105, it is often desirable to conformably encase a substantial portion if not the entirety of the protruding ONO tower 110, including its vertical sidewalls, in an electrically-insulating film, such as one composed of a silicon oxide. Quality and uniformity of the sidewall dielectric (not yet shown, instead; see briefly 250 of FIG. 2A) are important because the encasing oxide film will surround the sidewalls of the floating gate (FG) 112 and it will thereby define part of the charge retaining characteristics of the FG. Moreover, the encasing oxide film (not yet shown) will surround the sidewalls of the ONO stack 117 and it will thereby define part of the leakage current and voltage breakdown characteristics of the ONO stack 117. Additionally, the dimensional uniformity of the encasing oxide film (not yet shown) can participate in defining the effective capacitive coupling ($C=f(kA/d)$, $E=kV/d$) between the control gate (CG) 118 and the floating gate (FG) 112, and if present, an additional select gate (SG—see briefly 251 and 232 of FIG. 2D). As already explained above, for consistent results to occur among mass produced devices, it is important to maintain precise control over the effective plate area (A), the dielectric thickness (d), and the dielectric constant (k) of the various capacitive structures which form in each ONO memory cell stack 110 so that substantially same results will occur from cell to cell and from one mass produced device to the next for a given ones of control gate voltages ($V_{CG}$) and/or other electrode region voltages that induce respective, cell read operations, cell write operations, and/or cell erase operations.

This is the point in cell fabrication where problems may begin to arise due to shortcomings of conventional sidewall forming approaches. Silicon nitride does not usually oxidize as readily as does polysilicon in the presence of high temperature, molecular oxygen ($O_2$). Some types of polysilicons allow molecular oxidizing agents (e.g., $O_2$) to diffuse through the material of the polysilicon faster while other polysilicons exhibit slower rates. Under the conventional sidewall oxidation processes (e.g., HTO) that are used for sidewall spacer formation, the encroachment distance by which silicon oxide forms along the nitride sidewall parts (e.g., on the vertical sides of SiN-2 region 115) tends to be about one tenth (0.1 factor) the encroachment distance by which silicon oxide forms along the polysilicon parts of the sidewalls (e.g., on the vertical sides of Poly-2 region 118). As a result, a non-uniform dielectric sidewall develops.

Another problem with the conventional oxidation processes (e.g., HTO) is that the heated molecular oxidizing agents (e.g., $O_2$) readily diffuse through the SiO layers 114, 116 of the ONO stack 117 to thereby attack the underside of Poly-2 region 118 and the top surface of Poly-1 region 112. A set of Bird's Beak formations such as better seen at 155 and 156 of FIG. 1B develop as a result of incursion of the molecular oxidizing agents (e.g., $O_2$) through the SiO layers 114, 116.

Conventional oxidation for producing sidewall dielectric is not limited to HTO (High Temperature Oxidation). Other conventional methods that have been used include thermal oxidation with dry $O_2$ (molecular oxygen) and thermal oxidation with a wet combination of $O_2$ and $H_2$ (molecular hydrogen) and thermal oxidation with water vapor ($H_2O$). As used herein, the so-called, thermal oxidation with a wet combination of $O_2$ and $H_2$ refers to a process where a supplied stream of $H_2$ is burned (made to produce an invisible flame) in the presence of flowing $O_2$ to thereby form high temperature water vapor ($H_2O$) where the volumetric flow ratio of $H_2/O_2$ (each in terms of sccm) is in the range of 1.0 to 1.8. It is outside of conventional, mass-production practice to reduce the $H_2/O_2$ volumetric flow ratio below this range (more specifically, below 0.3) because the flame may become unstable at lower values of the ratio.

In terms of a more specific example for FIG. 1A, assume that the conventional, sidewall oxidizing process is HTO (High Temperature Oxidation) as is schematically indicated at 120. One particular HTO process flows DCS (dichlorosilane) and nitrous oxide ($N_2O$) over the exposed ONO memory cell stacks 110 (only one shown) in order to trigger an exothermic reaction which releases molecular oxidizing agents (e.g., $O_2$) along the exposed sidewalls of the ONO towers 110. The DCS plus $N_2O$ reaction simultaneously decomposes the DCS to provide silicon atoms for deposition and oxidation along the tower sidewalls. An encasing silicon oxide layer (not shown, see instead 250 of FIG. 2A) is quickly formed. Such quick formation is conventionally desired because the rapidity of the sidewall dielectric formation helps to reduce fabrication costs for mass produced devices. It also helps in minimizing thermal budget problems. Unfortunately, it also leads to significant formation of Bird's Beak structures such as shown at 155 and 156 in FIG. 1B.

Figure 1B:
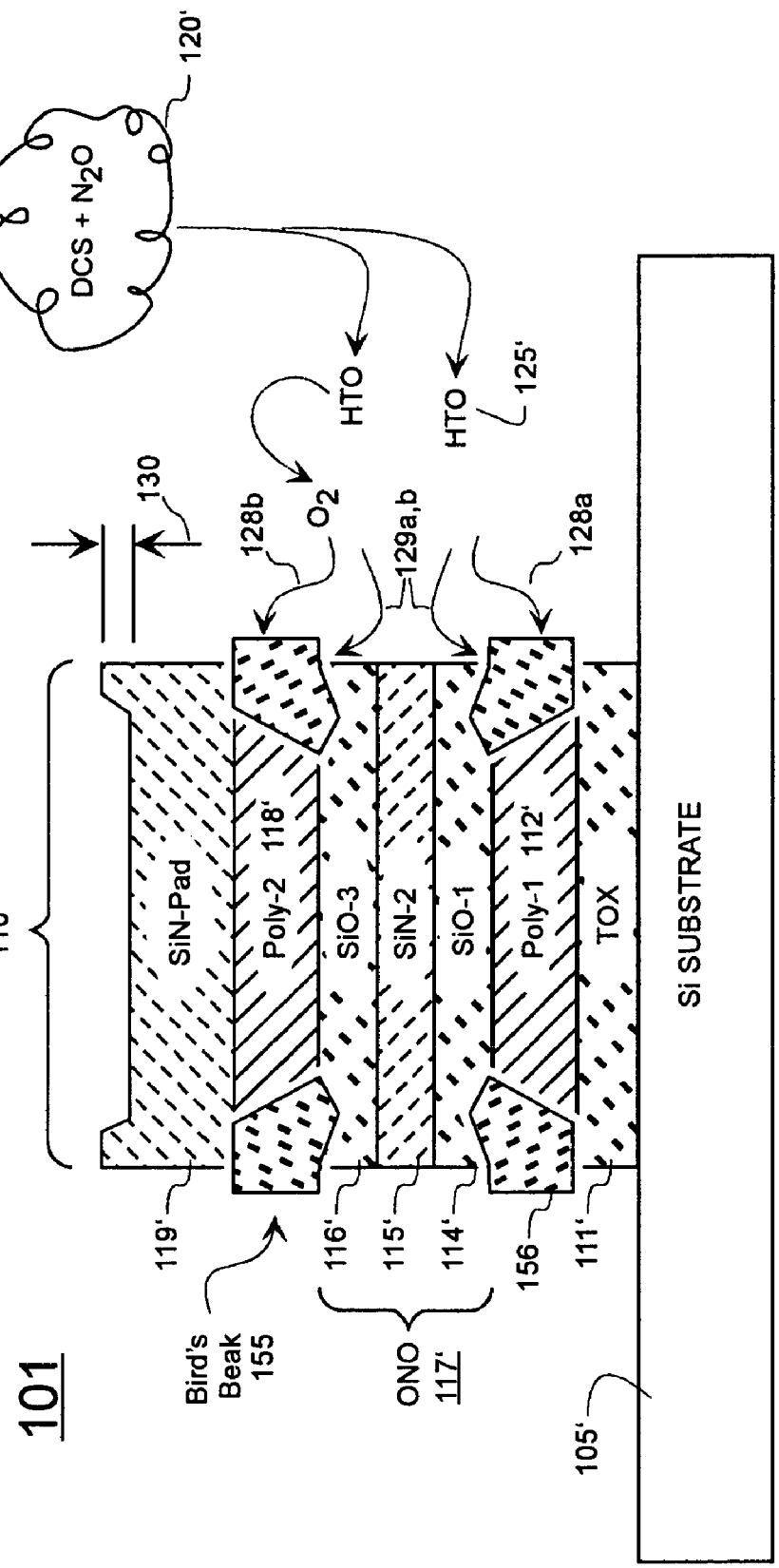
FIG. 1B is a schematic, side cross sectional diagram for explaining mechanisms that are believed to be responsible for formation of Bird's Beak deformations when a conventional process such as that started in FIG. 1A is used.

FIG. 1A highlights some attributes of the HTO oxidation process 120 which are believed to be responsible for forming Bird's Beak (155, 156 in FIG. 1B). One of the attributes that is believed to be responsible is the release of long-lived oxidizing moieties 125 (e.g., HTO-generated, molecular $O_2$) which do not penetrate well into the sidewalls of the silicon nitride regions 115 (SiN-2) and 118 (SiN-Pad). Instead, the long-lived oxidizing moieties 125 (e.g., molecular $O_2$) are diverted towards attacking the exposed sidewalls of polysilicon regions 112 (Poly-1) and 118 (Poly-2) and towards rapidly oxidizing the silicon present in those regions. Additionally, the released oxidizing moieties 125 of the HTO process have sufficiently long lifetimes (it is believed) to give them an opportunity to diffuse long distances, laterally through the SiO layers 114, 116 of the ONO stack 117 and to attack the underbelly of Poly-2 region 118 and the topside surface of Poly-1 region 112. As a result, the HTO deposition process 120 produces oxide sidewalls (not fully shown) which include the so-called, Bird's Beak features 155, 156 as shown in FIG. 1B.

The beginnings of Bird's Beak formation process is better seen by reference to FIG. 1B. The more rapid oxidation of the various polysilicon materials (118', 112') versus those of the silicon nitride materials (115', 119') produces horizontal protrusions such as are schematically illustrated at 128a and 128b. The diffusion-of-agent-through-oxide mechanisms in layers 116', 114' tend to produce vertical, Bird's Beak protrusions such as are schematically illustrated at 129a and 129b, where the vertical, Bird's Beak protrusions extend into the adjacent SiO-1 and SiO-3 regions (114' and 116'). The vertical, Bird's Beak protrusions 129a-129b also tend to produce height distortions, as are schematically illustrated at 130. Schematic icon 130 indicates that the heights of the sidewall portions (outer edges) of the memory cell ONO stack 110' are noticeably greater than the height of the central portion of the same stack 110'. The Bird's Beak formation can produce undesirable stresses in the stack 110' as well as non-uniform electric field distributions, different effective plate areas for the capacitive structures, and premature voltage breakdown. It would therefore be advantageous if practical methods could be found for reducing or eliminating Bird's Beak formation while still forming appropriate sidewall dielectric.

Figure 2A:
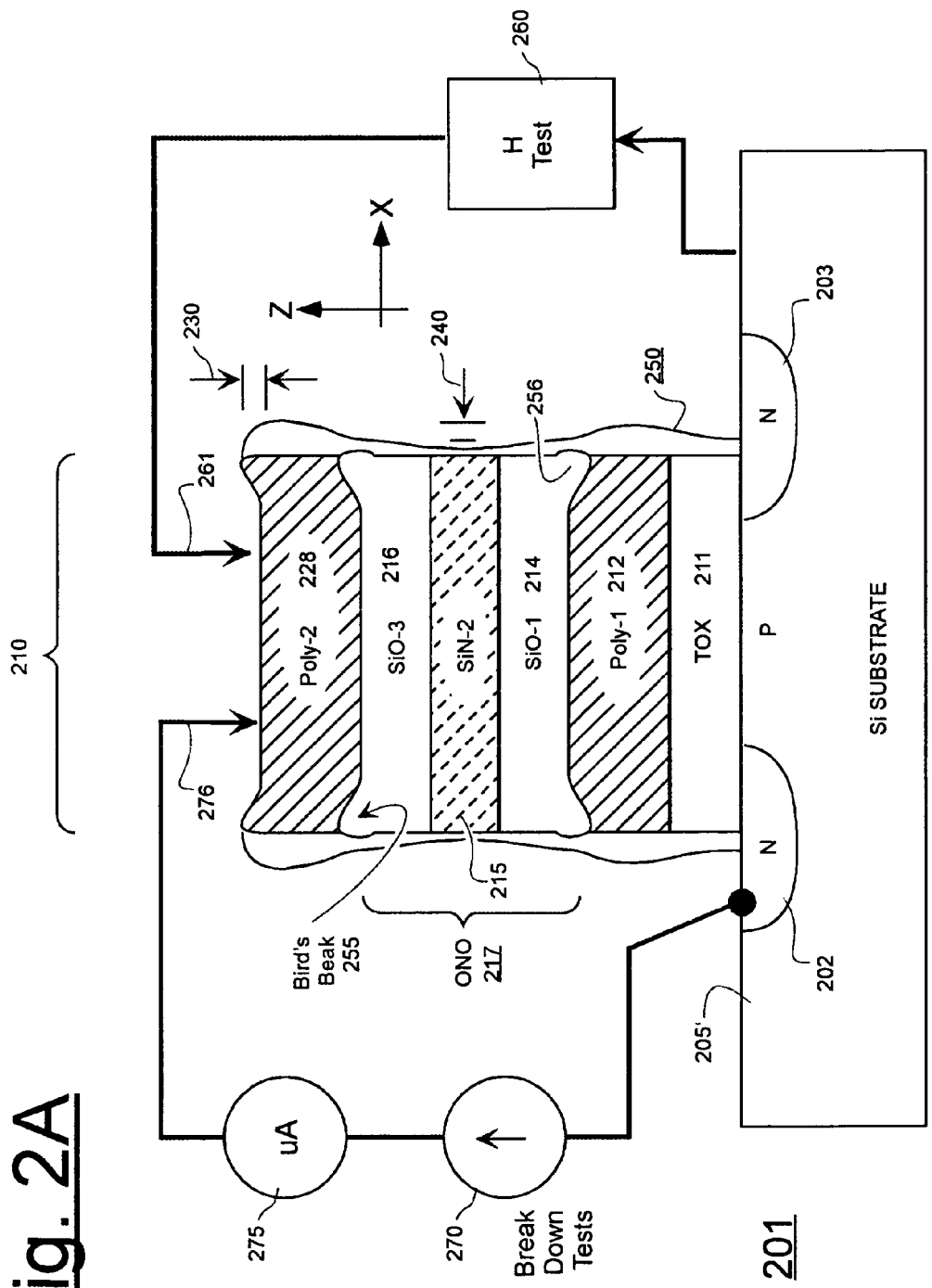
FIG. 2A is a schematic, side cross sectional diagram for explaining various tests which may be performed after a sidewall dielectric formation process such as that of FIGS. 1A-1B has been carried out, where the tests determine various characteristics of the resultant ONO-like memory cell stack.

FIG. 2A is a schematic, side cross sectional diagram which shows the aftermath of the HTO oxidation process (120' of FIG. 1B). A thicker oxide sidewall 250 has now developed around the outskirts of the ONO memory cell stack 210. The sacrificial silicon nitride (119' of FIG. 1B) has been stripped off so that electrical contact 276 can be made to the Poly-2 layer 228. It can be seen that the oxide sidewall 250 has thinner lateral thickness at 240, near the middle nitride portion 215 of the ONO stack 217 and that the sidewall dielectric 250 has comparatively greater lateral thickness near the sidewall sections of the Poly-1 and Poly-2 layers (212, 228). Additionally, the effective capacitor plate area and/or effective dielectric thickness between the Poly-1 and Poly-2 electrodes (212, 228) has been altered by the deformity introduced by the Bird's Beak formations 255, 256. (The upper and lower Bird's Beak formations, 255 and 256, are not necessarily same but inverted copies of one another because the respectively adjacent polysilicon and/or silicon oxide materials can be different.)

After the oxide sidewall 250 has been developed, respective source and drain regions 202 and 203 may be defined in the substrate 205' by way of self-aligned ion implant or otherwise for forming the memory transistor. Alternatively, for purposes of test, the resultant structure 201 may leave out TOX layer 211 so that polysilicon layer 212 makes direct electrical contact with a conductive region of substrate 205'. The latter alternative configuration may be used for more easily testing the resulting capacitor structures defined by layers 228, 216, 215, 214, 212 and the surrounding sidewall oxide 250. It may be desirable to know the extent of Bird's Beak formation (255, 256), the extent of sidewall thinning 240 and the effects of one or more of these on capacitive coupling between the control gate (CG—228) and the floating gate (FG—212), leakage current, breakdown voltages across various dielectric boundaries, etc.

Various physical and electrical tests may be performed on structure 201 after the sidewall oxidation process has produced the sidewall dielectric sub-structure 250. A first of the tests (H-tests 260) may determine the physical difference 230 in stack height between the outer edges of the ONO memory cell stack 210 and the middle of the cell stack 210. This difference 230 can be used in combination with the inner height value to express a height variation ratio, $R_H = H_{outer}/H_{inner}$ that indicates, in relative terms, how the sidewall oxidation process 120 has deformed the stack in the vertical direction and how much Bird's Beak formation has occurred in the vertical direction (Z-axis). A physical stylus 261 may be used to measure $H_{inner}$ and $H_{outer}$, or other means (e.g., ellipsometry, atomic force scanning microscope, tunneling scanning microscope) may be used for determining the height variation ratio, $R_H$, may be used as may be appropriate. If desired, similar stylus means may be used to determine the amount of dielectric thinning around region 240 (in other words, how much Bird's Beak deformation has occurred in the horizontal direction, along the X-axis). In one to-be-described variation (FIG. 2D) electrical means are instead used for characterizing the behavior of the sidewall dielectric in the horizontal direction. In one embodiment, electrical means are used for characterizing the behavior of the sidewall dielectric in the vertical direction. More specifically, very narrow, edge-sensitive capacitor structures are formed on the same die with the wider, and more normal ONO memory cell stacks 210. The edge-sensitive capacitor structures are so narrow that no middle dip section develops in them during sidewall oxidation. It is as if they are all edge and no middle. The capacitances of these edge-sensitive capacitor structures are measured, appropriate computational normalizations are made, and then they are compared to measured capacitances of the normal width structures to determine the magnitude of the vertical edge difference 230.

Another set of tests 270 may be carried out on the post-oxidation structures for determining breakdown and/or other electrical characteristics of the resultant ONO memory cell stack 210. In one such test, voltage is increased across a given dielectric region (e.g., 217) and leakage current is measured (275) until a hard or soft breakdown is observed. See FIG. 2B which will be detailed shortly. In another such electrical test, leakage current is integrated over time until hard or soft breakdown is observed. See FIG. 2C which will be detailed below. The electrical testing may be carried out with special purpose probes or contacts (e.g., 276) for making contact with appropriate conductive parts of the capacitor structure (210) or through use of available, on chip connections as may be available.

For one set of tests made on ONO memory cell stacks 210 resulting from using of HTO formation (120 of FIG. 1A), a height variation ratio, $R_H = H_{outer}/H_{inner}$ of about 1.32 was observed. For the same ONO memory cell stacks, which included a so-called, adjacent select gate (see 232 of FIG. 2D), an undesirable breakdown at about 10.4 V was observed between the floating gate (FG) electrode and the select gate (SG) electrode. See briefly, FIGS. 4A-4B which will be further detailed below.

Figure 2B:
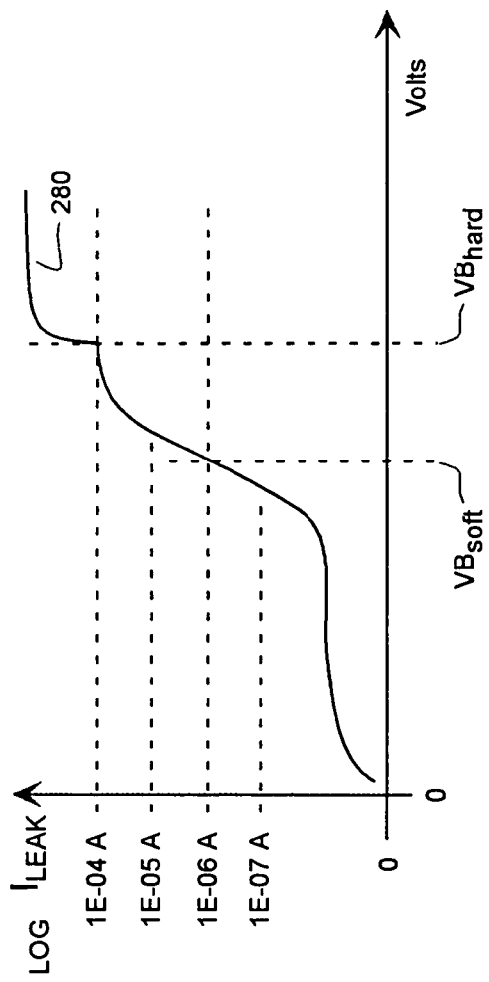
FIG. 2B shows a typical voltage breakdown plot.

Referring to FIG. 2B, a typical IV curve 280 (current versus voltage) is shown for characterizing dielectric breakdown. The horizontal voltage axis may be in terms of positive value of voltage, or negative, or absolute value depending on how a voltage creating source (e.g., 270 of FIG. 2A) is operated. The vertical current axis is typically arranged logarithmically so that increasing orders of leakage magnitude are spaced linearly going up the scale. In some situations, the reaching of a specific magnitude of $I_{LEAK}$ with increasing voltage, such as the one microampere (1E-06 A) level for a standard capacitor plate area (e.g., 1 mm$^2$), is deemed as a soft breakdown voltage ($VB_{soft}$). A rapid increase of $I_{LEAK}$ by one or more orders of magnitude for a small increase of stress voltage is often deemed as the hard breakdown voltage ($VB_{hard}$). $VB_{hard}$ is generally larger than $VB_{soft}$ and varies depending on quality and thickness of the stressed dielectric. Simply by way of example, for a given dielectric layer, $VB_{soft}$ may be around 6 volts while $VB_{hard}$ may be around 8 volts. Higher values for dielectrics of same thickness indicate that the dielectric is able to better withstand electric field stress.

Figure 2C:
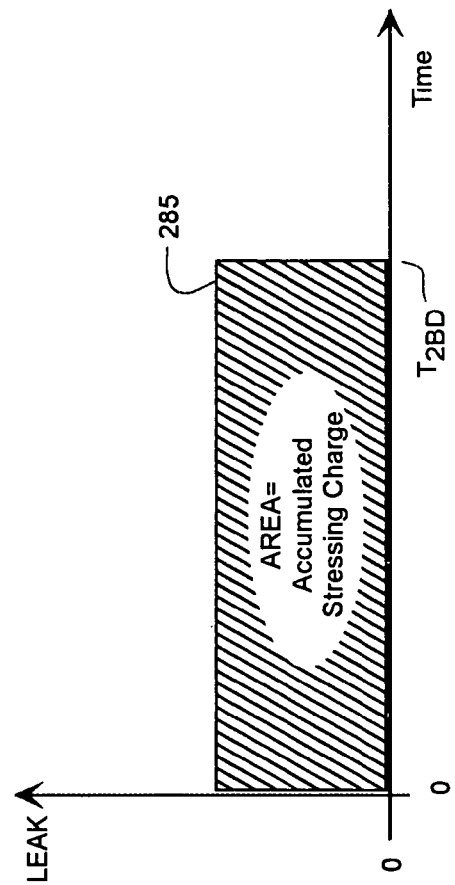
FIG. 2C shows a typical charge accumulation graph.

Referring to FIG. 2C, another test of the stress withstanding capabilities of different dielectrics, entails the pumping of a current of constant magnitude into respective capacitor structures of standard plate area (e.g., 1 mm$^2$) and comparable dielectric thicknesses while measuring time to soft and/or hard breakdown ($T_{2BD}$). The area under the $I_{LEAK}$-versus-Time curve (285) indicates the amount of charge (Q=VC) that has accumulated until the point of breakdown. Higher values of charge for a same breakdown value indicate higher capacitance by virtue of smaller dielectric thickness and/or greater dielectric constant.

Figure 2D:
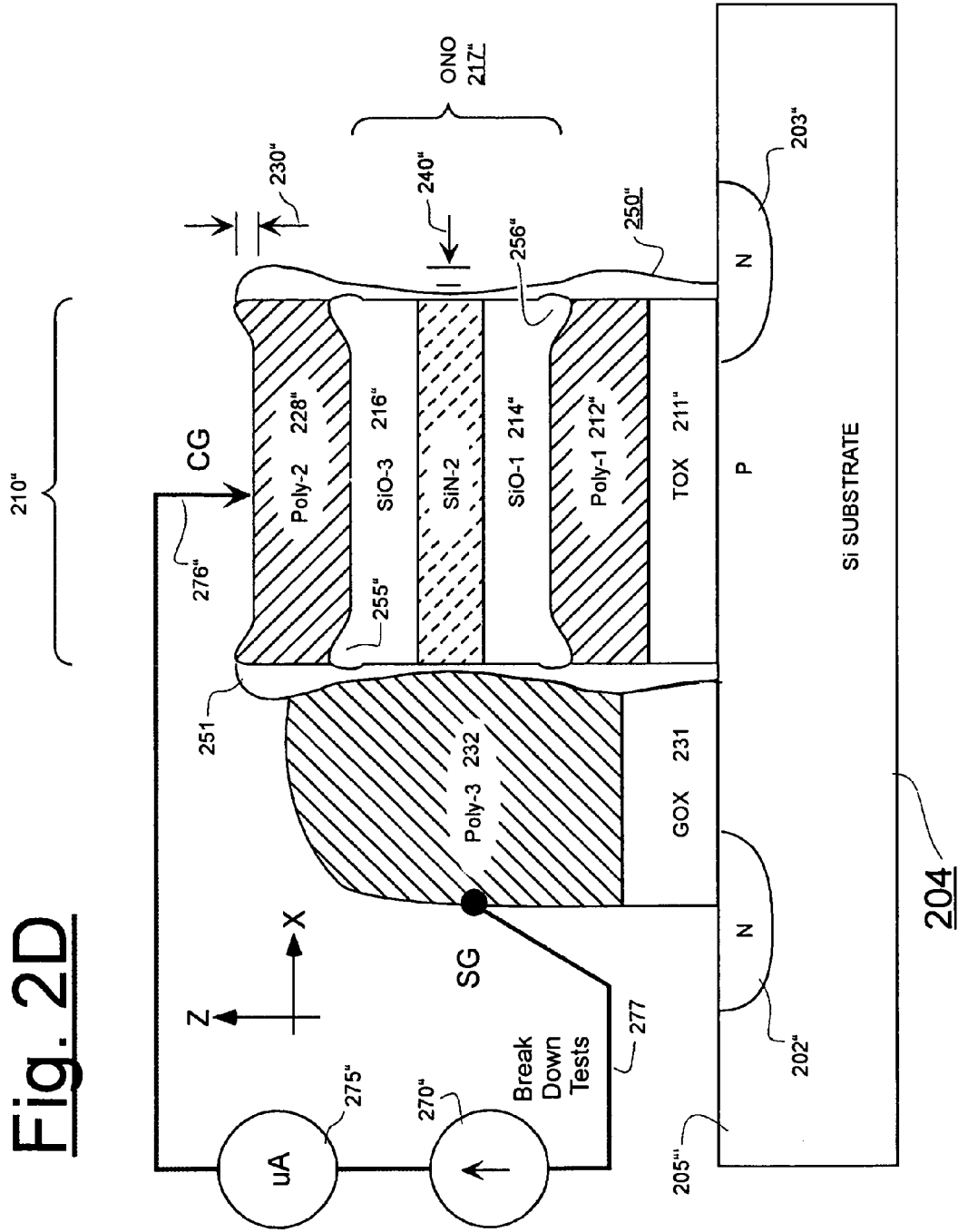
FIG. 2D is a schematic, side cross sectional diagram for explaining a variation where a select gate (SG) is fabricated adjacent to, but insulatively spaced apart from the ONO memory cell stack.

FIG. 2D is a schematic, side cross sectional diagram which shows the aftermath of HTO oxidation process (120' of FIG. 1B) for a slightly different structure 204 than that of FIG. 2A. Where practical, same reference numbers, but with double primes (") are used to reference alike components. Accordingly, a detailed description is not again necessary. One key difference in FIG. 2D is that a so-called, select gate (SG) has been formed by depositing conductive polysilicon 232 (Poly-3) on gate oxide 231 (GOX) after sidewall oxide 250" has been formed by a conventional oxidation method such as the HTO process 120 of FIG. 1A. The sidewall dielectric separating the select gate (SG) polysilicon 232 from the conductive Poly-1 and Poly-2 electrodes is denoted as 251. The source and drain regions, 202" and 203" may be formed in self-aligned manner to the gates by ion implant of dopants after the Poly-3 material is patterned. The gate oxide 231 (GOX) may be formed by thermal oxidation to have a thickness greater than that of the tunnel oxide (TOX) 211". Those skilled in the art will appreciate that an equivalent series connection of a select transistor and an integrated memory transistor are formed by this structure. Such combinations of select and stacked CG/FG gates are often found (generically speaking) in NAND organized FLASH devices. The quality and/or uniformity of the sidewall dielectric (e.g., 251) can be very important in NAND organized FLASH devices because, typically, multiple ones of ONO memory cell stacks like 210" will be placed close together to minimize per cell area. It is their respective sidewall dielectrics (e.g., 250, 251) that isolate their respective control gates (CG) and floating gates (FG) from one another.

A second key difference found in FIG. 2D, as compared to FIG. 2A, is that it becomes easier to test the lateral breakdown characteristics of the sidewall dielectric 251 when the select gate (SG) 232 is present. Such testing may be carried out by making appropriate connections to the contacts of the control gate (CG) electrode and of the select gate (SG) electrode as is indicated respectively at 276" and 277. The illustration of these SG-to-CG test modalities does not preclude the use of other tests, including those which measure Poly-1 to Poly-2 breakdown (CG to FG breakdown) and/or Poly-1 to Poly-3 breakdown (SG to FG breakdown) directly or by way of indirect, cell erase speed measurements. More on this, when FIGS. 4A-4C are detailed.

Figure 3A:
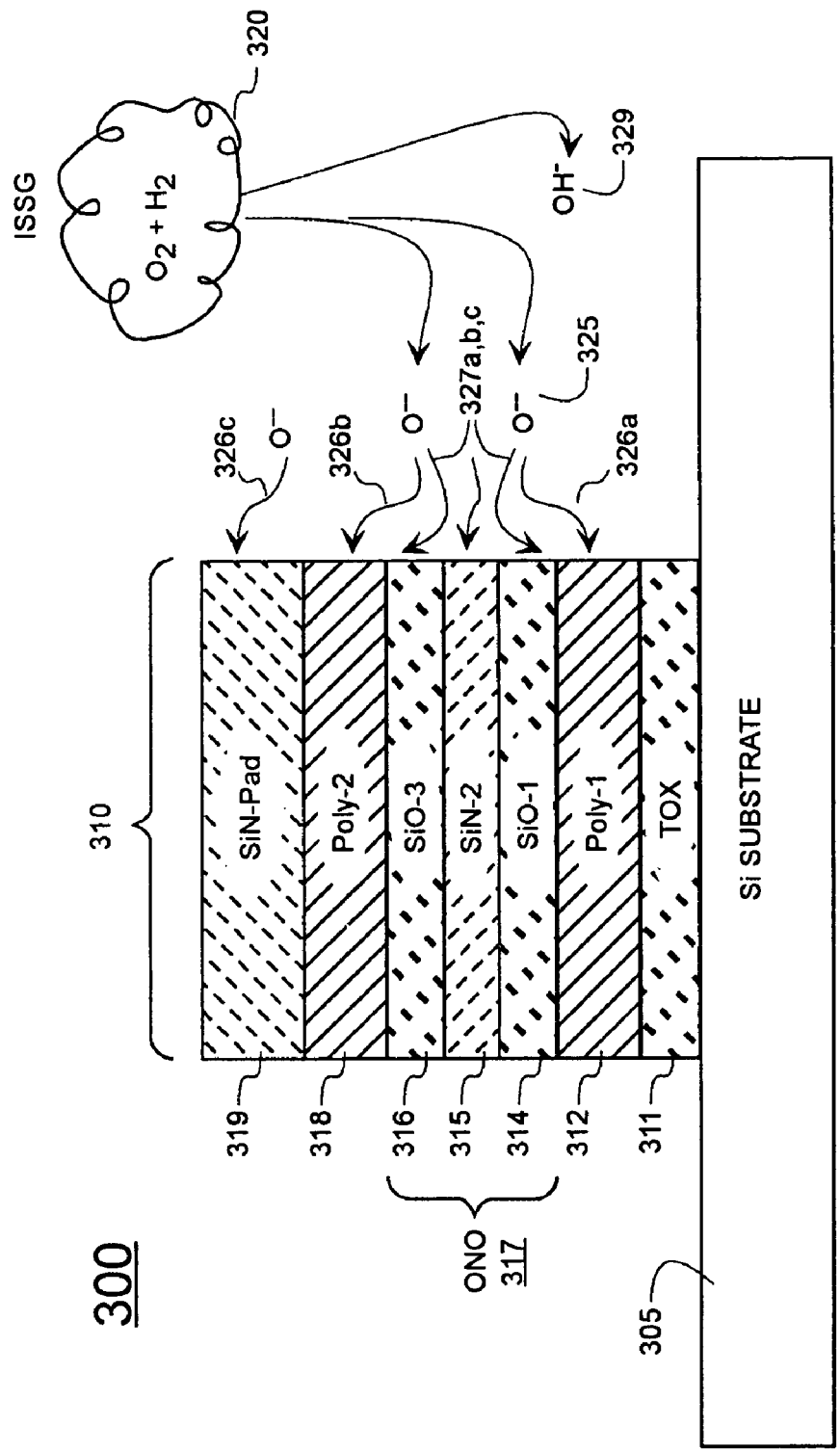
FIG. 3A is a diagram showing a possible mechanism whereby energetic, oxidizing radicals such as those of an ISSG step are used to more uniformly and initially oxidize the material-differentiated sidewalls of an ONO-like memory cell stack.

FIG. 3A is a schematic, side cross sectional diagram showing the start of a sidewall oxidation process 300 in accordance with the disclosure. As is the case in the above-described FIG. 1A, oxide sidewall material is to be formed on the sidewalls of a pre-formed and pre-patterned ONO memory cell stack 310. Like reference symbols and/or numbers in the "300" series are used for elements of FIG. 3A which correspond to but are not necessarily the same as the elements represented by similar symbols and reference numbers of the "100" series in FIG. 1A. As such, a repeated description of the stack-forming elements 311-319 found in FIG. 3A is omitted here. In one embodiment, the tunnel dielectric 311 is about 100 Å thick and is thermally grown via oxidation of the substrate 305. In the same embodiment, the bottom ONO oxide layer 314 is about 30 Å-80 Å thick and is formed in part by thermal oxidation of the Poly-1 layer 312. In the same embodiment, the middle nitride layer 315 is about 50 Å-120 Å thick and is formed in part by either remote plasma nitridation (RPN) of the bottom ONO oxide layer 314 and/or CVD deposition (e.g., HTO method). In the same embodiment, the top ONO oxide layer 316 is about 30 Å-70 Å thick and is formed in part by CVD deposition (e.g., HTO method). Both of the floating gate (FG) layer 312 and control gate (CG) layer 318 are doped to provide an application-specific conductivity characteristic and both are CVD deposited. Gate thickness varies according to application-specific considerations. Although not shown, in an alternate embodiment, RPN is applied to the top of the Poly-1 floating gate (FG) layer 312 to form a thin silicon nitride layer and this is then thermally oxidized to form a thin layer of thermal silicon oxide or thermal silicon oxynitride on top of the RPN nitride layer (not shown). Conventional ONO formation may then follow on top of this base structure. Basically a NONO stack is formed instead of just an ONO stack, where the bottom oxide includes thermal silicon oxide or thermal silicon oxynitride. Irrespective of this, the main point is that an ONO-type stack is provided, where the ONO-type stack has a plurality of material layers respectively composed of different materials (e.g., oxides, nitrides, oxynitrides, polysilicon) exposed at one or more sidewalls of the ONO-type stack and it is desirable to form a sidewall dielectric with good and uniform insulative properties along the multi-layered sidewall(s).

Unlike the case of FIG. 1A, the sidewall-dielectric forming process 300 of FIG. 3A includes use of a so-called dry-ISSG process 320. ISSG is an industry-recognized acronym for In-Situ Steam Generation. However, despite its name, wet steam is not formed in dry-ISSG. Instead, a stream of $H_2$ is supplied in the presence of a volumetrically, faster flowing stream of $O_2$ and in the presence of heat (e.g., provided from IR lamps, not shown) to thereby produce free atomic oxygen (e.g., $O^{--}$) and/or other radicals (not molecularly bound) which can combine with the materials in the multi-layered tower sidewalls to form sidewall dielectric. In one set of embodiments, the volumetric flow ratio of $H_2/O_2$ (each in terms of sccm) is less than about 0.2. In a subset of these embodiments, the volumetric flow ratio of $H_2/O_2$ is less than about 0.1. In another subset of these embodiments, the volumetric flow ratio of $H_2/O_2$ is equal to, or less than, about 0.02.

The ISSG-produced free atomic oxygen (e.g., $O^{--}$) and/or hydroxyl (e.g., $OH^-$) radicals and/or other radicals are believed to form adjacent to the sites where sidewall dielectric initially begins to form. In one embodiment, a dry and low-pressure mixture of hydrogen gas ($H_2$) and oxygen gas ($O_2$) is streamed over a wafer while the wafer is rapidly heated (e.g., by RTP heating) to a high temperature of about 1000° C. The combination of supplied reactant gases and heat tends to generate both atomic oxygen (which could be in charged or neutral forms such as: $O^{--}$, $O^-$, $O^0$, $O^+$, $O^{++}$) and hydroxyl radicals (OH) at the exposed sidewall surfaces. The atomic oxygen and/or hydroxyl radicals can diffuse into the exposed surface materials at various diffusion rates to produce correspondingly oxidized reaction products. An Applied Materials Centura™ Rapid-Thermal-Processing (RTP) reactor may be used for carrying out the dry-ISSG process. The Centura™ RTP tool (available from Applied Materials of Santa Clara, Calif.) can be modified to provide an ISSG operation with the volumetric flow ratio of $H_2/O_2$ being less than about 0.3 (that is, 30%), less than about 0.1 (10%), and even as low as about 0.02 (2%).

More specifically, in one embodiment according to the present disclosure, an ISSG recipe is used in an Applied Materials Centura™ Rapid-Thermal-Processing (RTP) reactor as set forth in Table 1.

TABLE 1

| Step(s) | Step Details |
| --- | --- |
| 1,2,3 | Provide open-loop rapid thermal heating of in-chamber workpieces to an initial temperature of 482° C. at a pressure of 7.7 Torr and an O2 flow of 9.8 slm (standard liters per minute) |
| 4 | Provide a control-stabilizing ramp-up of temperature at 30° C./second from 482° C. to 500° C. with O2 flow at 9.8 slm |
| 5 | Provide a controlled ramp-up of temperature at 75° C./second from 500° C. to 850° C. with O2 flow at 9.8 slm |
| 6 | Provide a controlled slower ramp-up of temperature at 500° C./second from 850° C. to 900° C. with O2 flow at 9.8 slm |
| 7 | Provide a controlled & yet slower ramp-up of temperature at 25° C./second from 900° C. to 950° C. with O2 flow at 9.8 slm and H2 flow turned on at 0.2 slm |
| 8** | Maintain 950° C. for 200 seconds with O2 flow at 9.8 slm and H2 flow at 0.2 slm (so the volumetric flow ratio of $H_2/O_2$ is therefore approximately 0.0204.) |
| 9 | Provide a controlled ramp-down of temperature at 35° C./second from 950° C. to 690° C. with O2 and H2 flows |

TABLE 1-continued

| Step(s) | Step Details |
| --- | --- |
|  | turned off and N2 flow turned on at 5 slm |
| 10 | Further ramp down and/or processing |

Step 8 of Table 1 is where most of the dry-ISSG occurs to provide sidewall oxidation to a thickness of about 70 Å. The process can be varied as appropriate to provide ISSG-generated sidewall oxide in thickness range of about 20 Å to about 300 Å. The ISSG operating temperature may be set in, or varied over the range of about 850° C. to about 1050° C. The ISSG process maintenance time may be set in, or varied over the range of about 20 seconds to about 300 seconds. The $O_2$ flow rate may be set in, or varied over the range of about 3 slm to about 10 slm. The $H_2$ flow rate may be set in, or varied over the range of about 0.1 slm to about 1 slm. The $H_2/O_2$ volumetric flow ratio may be set in, or varied over the range of about 0.3 to about 0.01, and in one subset of embodiments, in, or over the range of about 0.1 to about 0.02. Pressure in the RTP chamber may be set in, or varied over the range of about 5 Torr to about 50 Torr.

Referring still to FIG. 3A, a more detailed examination is made of the locations where the oxidizing agents of the ISSG process 320 may react with surface materials and/or enter surfaces by diffusion to react with adjacent materials. Although it is believed that atomic oxygen (325) is the primary oxidizing agent, it is possible that other byproducts (e.g., OH radicals 329) of the ISSG process may also act as oxidizing agents. It is believed that the atomic oxidizing agents 325 supplied at the sidewall surfaces are highly reactive and generally short-lived as compared to longer-lived, oxidizing agents formed by HTO or the like. As a result, much of the available oxidizing agents 326a, 326b concentrates near the exposed polysilicon sidewalls (Poly-1 and Poly-2) and quickly forms silicon oxide on those sidewalls. The available oxidizing agents 326c, 327c are believed to be sufficiently reactive to form silicon oxide and/or silicon oxynitrides ($SiO_xN_y$) at the exposed SiN sidewalls of layers 315 and 319. Oxidation rates on the order of as much as about 0.6 of silicon oxidation rates are believed possible at the nitride sidewall portions. Some of the ISSG produced, oxidizing agents, 327a-327b, may diffuse into exposed silicon oxide layers (314, 316) to thereby attack the underbelly of the Poly-2 layer 318 and the top of the Poly-1 layer 312 and to thereby produce some amount of Bird's Beak formation. However, because of the short life span and/or high reactivity of such ISSG produced, oxidizing agents, 327a-327b, it is believed that they extinguish rapidly and do not penetrate as deeply into the silicon oxide layers (314, 316) and/or to the same extent as can the longer-lived oxidizing agents (e.g., 127a,b in FIG. 1A) of HTO processes (120) or the like. As a result, Bird's Beak formation is reduced (as will be demonstrated shortly by experimental results).

Figure 3B:
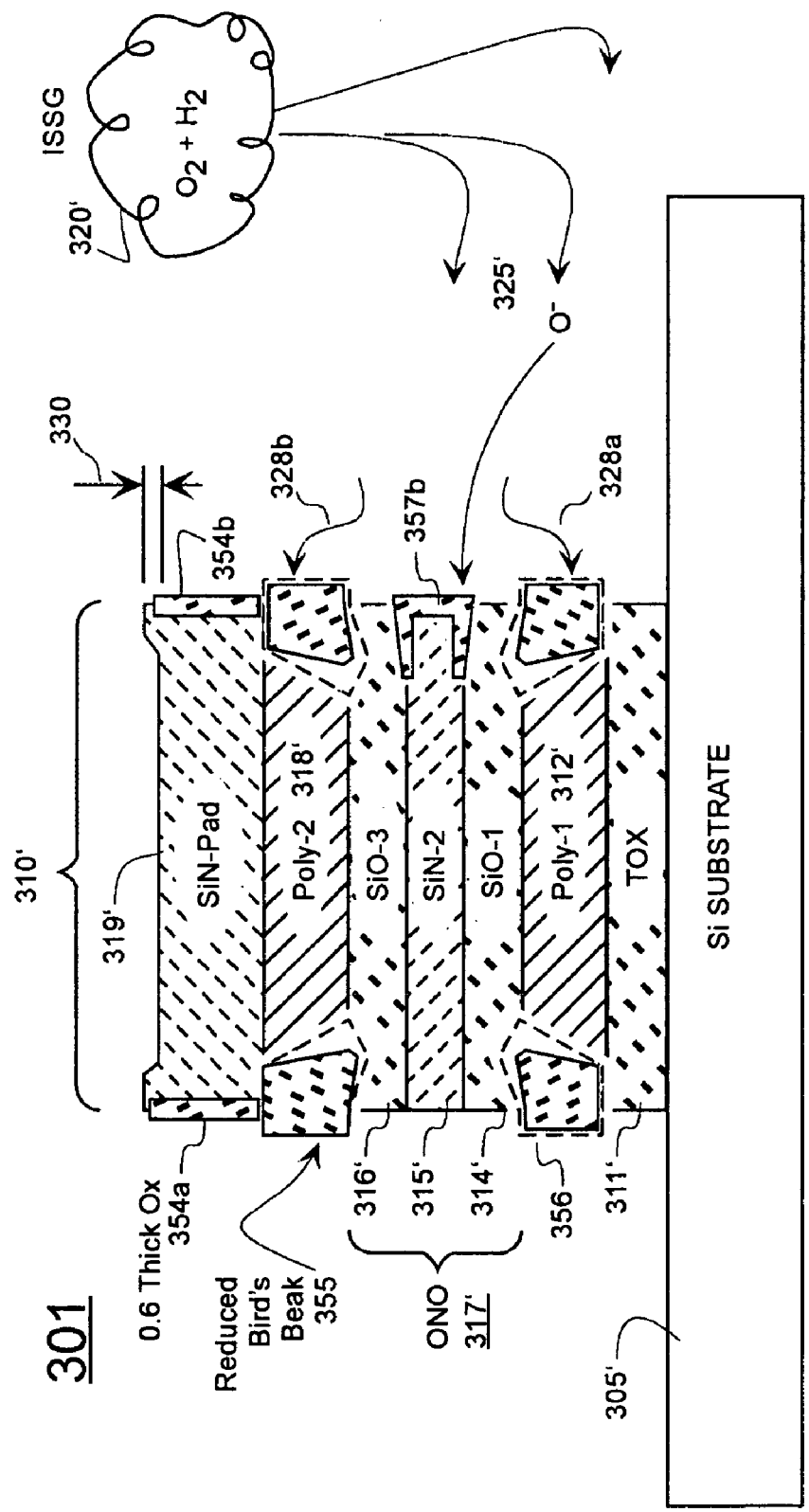
FIG. 3B is a schematic, side cross sectional diagram corresponding to FIG. 1B but explaining mechanisms that are believed to be responsible for reduction of Bird's Beak deformation when a free radical, oxidizing agent process such as that started in FIG. 3A is used.

FIG. 3B is the dry-ISSG counterpart to the cross sectional view of HTO FIG. 1B. Where practical, like reference symbols and numbers in the "300" primed series are used for elements of FIG. 3B which correspond to but are not necessarily the same as the elements represented by similar primed symbols and reference numbers of the "100" series in FIG. 1B. As such, a repeated introduction is not necessary. Unlike the case of FIG. 1B, the ISSG-formed sidewall from oxidation process 301 does not produce as large a Bird's Beak formation 355, 356 as would have occurred if HTO oxidation had been used as an initial method directly against the exposed sidewall surfaces of ONO memory cell stack 310'.

Moreover, unlike the case of FIG. 1B, oxide formation and buildup at exposed silicon nitride sidewall surfaces such as those of pad layer 319' is substantially greater and faster. Oxidation rates on the order of as much as about 0.6 of silicon oxidation rates are believed to occur at the nitride sidewall portions. Accordingly, a 0.6 relative thickness of oxide (60%) is schematically indicated to have developed at silicon nitride sidewall surfaces 354a and 354b. Similarly, an appropriate 0.6 factor (60%) of relative lateral thickness of oxide is schematically indicated to have developed at silicon nitride sidewall surface 357b for the exposed portion of SiN-2 layer 315'. (Oxide formation is not shown on the left side of 315' merely to provide room for reference number lead lines. However, it is to be understood that silicon oxide and/or silicon oxynitride will form on the left side of layer 315' similar to what is shown at 357b, on the right side.) Since some of the highly reactive and generally short-lived atomic oxidizing agents 325' are consumed by the nitride sidewall surfaces rather than being all diverted for diffusion towards the underside of the Poly-2 layer (318') and/or the topside Poly-1 layer (312'), there is less Bird's Beak formation and a smaller deviation 330 of stack height between the outer edges of the ONO memory cell stack 310' and the middle of the cell stack 310'. As a result, the height variation ratio, $R_H = H_{outer}/H_{inner}$ becomes smaller than that which is seen with conventional HTO-based oxidation of the ONO sidewalls. This will be demonstrated from experimental results shortly (see FIG. 4A).

Referring to FIG. 3C, after an initial thickness of dry-ISSG-grown sidewall dielectric 350 has been formed (e.g., about 70 Å to about 300 Å in thickness), a further and supplemental thickness of sidewall dielectric (390, not fully shown) may be provided by HTO process 380 and/or other conventional, sidewall dielectric forming techniques. The ISSG-grown sidewall dielectric 350 can function as a protective padding, as a strengthening and/or as a diffusing skin which limits the development of additional Bird's Beak formation at 355'' and/or 356''. More specifically, the HTO oxidizing agents 385 are diffusion-rate limited by the ISSG-grown sidewall dielectric 350 from getting to the underside of the Poly-2 layer 318'' to add to Bird's Beak formation 355'' and from getting to the topside of the Poly-1 layer 312'' to add to Bird's Beak formation 356''. Application-appropriate combinations of initial ISSG-growth (320) of initial sidewall dielectric (350) and subsequent supplemental formation (e.g., by HTO 380 or other) of further sidewall dielectric (390, not fully shown) may be used to achieve desired thickness and breakdown strength for the overall sidewall dielectric (350 plus 390). As already noted, HTO-based formation of sidewall dielectric is relatively fast. A combination of initial ISSG and subsequent HTO formation of sidewall dielectric can provide practitioners with a balanced set of advantages from both types of sidewall fabrication.

For sake of comparison, FIG. 3C shows in dashed outline the outer profile 250'' of the initial dielectric skin that would have formed had HTO been used for creating the initial sidewall skin rather than ISSG. It may be seen from the schematic representation at 340 that lateral thickness variation adjacent to the nitride portions (e.g., 315'') of the sidewall can be significantly less with ISSG-based formation as compared to what would have occurred with use of HTO or the like for initial sidewall dielectric formation. The pad silicon nitride 319' of FIG. 3B is not shown in FIG. 3C for sake of simplifying the illustration. It is to be understood however, that the pad silicon nitride 319' will generally still be present at the time of the supplemental HTO oxidation 380 and that it will be stripped off by HF etch or otherwise after that. The final thickness (390) provided by the supplemental HTO oxidation 380 may include sacrificial thickness that is subsequently lost during the etchback 395 of the sacrificial nitride 319' (nitride is shown in FIG. 3B).

Referring to FIG. 4A, the results of a first set of experiments is shown by way of an iconic bar graph 400. Both a conventional HTO sidewall oxidation process and an ISSG-based sidewall oxidation process (in accordance with the disclosure) were used to form sidewall dielectric on similar ONO memory cell stacks (e.g., 110, 310 of respective FIGS. 1A and 3A). Measurements were taken of the resultant inner and outer stack heights, $H_{inner}$ and $H_{outer}$. Statistical regression was used to reduce experimental noise, and height variation ratios, $R_H = H_{outer}/H_{inner}$ were computed respectively for the statistically-corrected results of the HTO sidewall oxidation process and the ISSG-based sidewall oxidation process. As indicated in the bar graph 400, the computed $R_H$ value for the HTO-based devices was found to be about 1.32 and the computed $R_H$ value for the ISSG-based devices was found to be about 1.16. This may not seem like a big difference, but it is. FIG. 4A uses iconic bar symbols 410 and 430 to visually demonstrate the difference. The ratio between the outer edge height of first iconic bar symbol 410 and its indented, inner height is about 1.32. The ratio between the outer edge height of second iconic bar symbol 430 and its indented, inner height is about 1.16. It can be visually appreciated from these that the represented amount of vertical height deformation is significantly different. (For a normalized visual comparison, see icons 422 and 432 of FIG. 4B.) It is expected that $R_H$ values for the ISSG-based devices can be in the range of about 1.20 or less, and even be less that about 1.16 depending on the compositions of the multiple material layers that from the ONO-type stack (could be NONO) and depending the rapid thermal heating method used and on the specific volumetric flow rates used for the gases that are energized to provide atomic oxygen and/or OH radicals and on any carrier gas (e.g., argon, $N_2O$) that may be further present in the ISSG tool chamber. (In one further embodiment of the ISSG process, atomic oxygen radicals are obtained from exothermic reaction of $N_2O$ alone ($N_2O$ plus decomposition triggering heat) or with a combustible second agent (e.g., $H_2$) and the combination of freed atomic oxygen and freed nitrogen radicals may be used to form a sidewall dielectric having both oxygen and nitrogen in it.)

Referring to FIG. 4B, the results of a second set of experiments is shown by way of an iconic bar graph 402. Both a conventional HTO sidewall oxidation process and an ISSG-based sidewall oxidation process (in accordance with the disclosure of FIG. 3A) were used to form sidewall dielectric on similar ONO memory cell stacks (e.g., 110, 310 of respective FIGS. 1A and 3A). Measurements were taken of breakdown voltage characteristics. In this second set of experiments, select gates (SG) such as shown at 232 of FIG. 2D were present. Soft breakdown voltages were measured and statistically compiled for stress voltages applied both between the select gate (SG: Poly-3) and the floating gate (FG: Poly-1) and between the select gate (SG: Poly-3) and the control gate (CG: Poly-2). The results are respectively denoted as $BV_{13}$ for the first case and $BV_{23}$ for the second case. As seen at 431 in FIG. 4B, the HTO-based devices exhibited a statistically-averaged breakdown voltage of $BV_{13} = 10.4$ volts. By comparison, icon 431 illustrates that the ISSG-based devices exhibited a statistically-averaged and greater breakdown voltage of $BV_{13} = 12.1$ volts. Both of the HTO-based devices and the ISSG-based devices exhibited a statistically-averaged, SG to CG breakdown voltage of $BV_{23} = 12.0$ volts. However, because the SG to FG breakdown voltage (at 421) is smaller rather than about the same as the corresponding SG to CG breakdown voltage (at 422) for the HTO-based devices, this indicates a non-uniform thickness and/or quality of separation dielectric (251). On the other hand, because the SG to FG breakdown voltage (at 431) is about the same as the corresponding SG to CG breakdown voltage (at 432) for the ISSG-based devices, this indicates a substantially more uniform thickness and/or quality of separation dielectric (251). In other words, the similarity between the 431 and 432 breakdown voltages indicates that the ISSG initial, sidewall oxidation process produces a more uniform thickness of separation dielectric (251) when moving along the vertical (Z) axis. This yet another indicator that Bird's Beak formation is substantially reduced.

Referring to FIG. 4C, the results of a third set of experiments is shown by way of an iconic bar graph 403. Both a conventional HTO sidewall oxidation process and an ISSG-based sidewall oxidation process (in accordance with the disclosure of FIG. 3A) were used to form sidewall dielectric on similar ONO memory cell stacks (e.g., 110, 310 of respective FIGS. 1A and 3A). Both forms of ONO memory cells were subjected to full charging (moving electrons onto the floating gate (FG)) and then respective erase operations of substantially same erase voltage (applied to CG) and substantially same erase duration. Thereafter, measurements were taken of the CG-to-source threshold voltages at which the corresponding memory cell transistors turn on (exhibit conduction across their channels). A higher threshold voltage, when observed in the test transistors, indicates that there is more conduction-inhibiting charge retained in the respective floating gate (FG) and therefore the erasure was not as thorough as the comparable erasure of a counterpart other memory cell that has a lower threshold voltage. That is indicative of the capacitive coupling that occurred between the control gate (CG) and the floating gate (FG) during the duration-limited erasure. Bird's Beak formation tends to reduce capacitive coupling between the CG and the FG. Thus, if Bird's Beak formation is reduced, one can expect to see a corresponding increase in capacitive coupling between the CG and the FG during erasure and a corresponding decrease of post-erase threshold voltage ($V_{Tpe}$).

FIG. 4C shows such a corresponding decrease of post-erase threshold voltage ($V_{Tpe}$) when switching from use of HTO for initial oxidation of the tower sidewalls (bar 441) to use of ISSG in accordance with the disclosure, for initial oxidation of the tower sidewalls (bar 442). More specifically, graphed bar 441 indicates a statistically-averaged $V_{Tpe}$ (over mass production lots) of 1.80V for the HTO oxidized memory cells while graphed bar 441 indicates a statistically-averaged $V_{Tpe}$ of 1.15V for the memory cells whose ONO towers had their sidewalls initially oxidized by a dry-ISSG process in accordance with the disclosure. As can be seen, the ISSG process produced superior results. Shorter erase time is desirable in FLASH memory cells because that reduces overall re-write time. The ISSG process produced FLASH memory cells with comparatively shorter erase time, as is evidenced by the smaller post-erase threshold voltage ($V_{Tpe}$) at 442.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of a first example of a further modification in accordance with the disclosure, the sidewall dielectric forming radicals may include freed nitrogen radicals where the freed atomic oxygen (e.g., $O^-$ and/or $O^{-2}$) is obtained from and carried within a heated and flowing $N_2O$ gas stream where the flowing $N_2O$ gas is triggered into undergoing an exothermic decomposition reaction of the form:

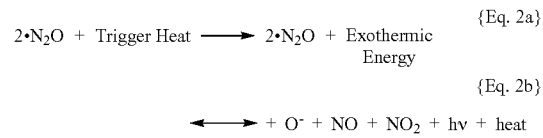

(Note: the actual reaction may be more complex than merely this and other moieties may be generated due to trace contaminants and/or due to further recombinations of the available atoms.) The released atomic oxygen and NO radicals can then form sidewall oxide.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A method of forming sidewall dielectric on an ONO-type memory cell stack where at least one sidewall of the ONO-type memory cell stack includes at least three exposed material layers with at least two of the exposed material layers being respectively composed of an oxide and an oxidizable material disposed adjacent to the oxide, the method comprising:
- (a) subjecting the at least one sidewall to a dry ISSG process (In-Situ Steam Generation) where the dry ISSG process comprises:
  - (a.1) flowing molecular oxygen ($O_2$) towards the stack; and
  - (a.2) flowing molecular hydrogen ($H_2$) towards the stack, where the volumetric flow ratio of the $H_2$ to the $O_2$ is less than about 0.2;

wherein said oxidizable material has a sacrificial nitride layer disposed thereon and the method further comprises:
- (b) stripping off the sacrificial nitride layer after performance of said step (a) of subjecting the at least one sidewall to the dry ISSG process.

2. The sidewall dielectric forming method of claim 1 wherein:
- (a.2a) said volumetric flow ratio of $H_2/O_2$ is less than about 0.1.

3. The sidewall dielectric forming method of claim 1 wherein:
- (a.2a) said volumetric flow ratio of $H_2/O_2$ is equal to, or less than, about 0.02.

4. The sidewall dielectric forming method of claim 3 and further comprising:
- (b) rapidly heating the flowing oxygen ($O_2$) and flowing hydrogen ($H_2$) to a temperature in the range of about 850° C. to about 1050° C. as they flow towards said at least one sidewall.

5. The sidewall dielectric forming method of claim 3 and further comprising:
- (b) continuing the subjecting of the at least one sidewall to the dry ISSG process for a duration selected from the range of about 20 seconds to about 300 seconds.

6. The sidewall dielectric forming method of claim 3 and further comprising:
- (b) establishing a chamber pressure for the flowing oxygen ($O_2$) and flowing hydrogen ($H_2$) in the range of about 5 Torr to about 50 Torr.

7. The sidewall dielectric forming method of claim 3 and further wherein:
a height variation ratio, $R_H = H_{outer}/H_{inner}$, determined for the ONO-type memory cell stack after formation of the sidewall dielectric by the dry ISSG process, is about 1.20 or less, where $H_{inner}$ represents a stack height at a lateral position in the stack that is spaced away from the stack edges and where $H_{outer}$ represents a stack height at a lateral position near or at one of the stack edges.

8. The sidewall dielectric forming method of claim 1 and further comprising:
- (a.1a) varying the $O_2$ flow rate over the range of about 3 slm to about 10 slm (ten standard liters per minute).

9. The sidewall dielectric forming method of claim 1 and further comprising:
- (a.2a) varying the $H_2$ flow rate over the range of about 0.1 slm to about 1 slm.

10. The sidewall dielectric forming method of claim 1 and further wherein:
- (b) said at least three exposed material layers of the ONO-type memory cell stack includes:
  - (b.1) a first silicon nitride layer;
  - (b.2) a first silicon layer; and
  - (b.3) a first silicon oxide layer adjacent to the first silicon layer.

11. The sidewall dielectric forming method of claim 10 and further wherein said at least three exposed material layers of the ONO-type memory cell stack includes:
- (b.4) a second silicon layer;
- (b.5) a second silicon oxide layer;
- (b.6) a tunnel dielectric layer;
- (b.7) wherein the first silicon nitride layer is interposed between the first and second silicon oxide layers; and
- (b.8) wherein the combination of the first and second silicon oxide layers and the first silicon nitride layer is interposed between the first and second silicon layers.

12. The sidewall dielectric forming method of claim 11 and further wherein lateral sidewall breakdown voltages are substantially uniform along the height of the ONO-type memory cell stack after formation of the sidewall dielectric by the dry ISSG process.

13. The sidewall dielectric forming method of claim 11 and further wherein a larger erase speed is obtained in a memory cell having said ONO-type memory cell stack after formation of the sidewall dielectric by the dry ISSG process, where the larger erase speed is larger than a corresponding erase speed obtained in a corresponding memory cell having an ONO-type memory cell stack with sidewall dielectric formed by a dichlorosilane-based HTO process.

14. The sidewall dielectric forming method of claim 1 and further comprising:
- (b) after said dry ISSG process, forming further and supplemental sidewall dielectric by a non-ISSG oxidation process.

15. The sidewall dielectric forming method of claim 1 and further comprising:
- (a.1a) setting the $O_2$ flow rate over the range of about 3 slm to about 10 slm (ten standard liters per minute).

16. The sidewall dielectric forming method of claim 15 and further comprising:
- (a.2a) setting the $H_2$ flow rate over the range of about 0.1 slm to about 1 slm.

17. The sidewall dielectric forming method of claim 1 wherein method is part of mass production process that mass produces integrated circuits to have consistent, predefined performance characteristics.

18. The sidewall dielectric forming method of claim 1 wherein said step (a.2) of flowing the molecular hydrogen ($H_2$) towards the stack is constrained to below a volumetric flow ratio of $H_2$ to $O_2$ at which formation of a hydrogen flame due to the presence of $H_2$ is at least unstable if not that the flame is extinguished or unignited due to insufficient presence of $H_2$.

19. The sidewall dielectric forming method of claim 1 wherein said step (a.2) of flowing the molecular hydrogen ($H_2$) towards the stack is constrained to below a volumetric flow ratio of $H_2$ to $O_2$ at which stable ignition of a hydrogen flame due to the presence of $H_2$ is assured on a mass production basis.

20. A method of forming sidewall dielectric on an ONO-type memory cell stack where at least one sidewall of the ONO-type memory cell stack includes at least three exposed material layers with at least two of the exposed material layers being respectively composed of an oxide and an oxidizable material disposed adjacent to the oxide, the method comprising:
- (a) subjecting the at least one sidewall to a dry ISSG process (In-Situ Steam Generation) where the dry ISSG process comprises:
  - (a.1) flowing molecular oxygen ($O_2$) towards the stack; and (a.2) flowing molecular hydrogen (H$_2$) towards the stack, where the volumetric flow ratio of the H$_2$ to the O$_2$ is less than about 0.2;

(b) after said dry ISSG process, forming further and supplemental sidewall dielectric by a non-ISSG oxidation process;

wherein said non-ISSG oxidation process includes use of dichlorosilane.

21. The sidewall dielectric forming method of claim 20 wherein said oxidizable material has a sacrificial nitride layer disposed thereon and the method further comprises:

(b) stripping off the sacrificial nitride layer after performance of said step (a) of subjecting the at least one sidewall to the dry ISSG process.

* * * * *